(12) United States Patent
Murdock

(10) Patent No.: US 6,351,501 B1
(45) Date of Patent: Feb. 26, 2002

(54) APPARATUS AND METHOD FOR PROVIDING DIRECT CURRENT BALANCED CODE

(75) Inventor: Gary S. Murdock, San Jose, CA (US)

(73) Assignee: National Semiconductro Corporation, Santa Clara, CA (US)

( * ) Notice: Subject to any disclaimer, the term of this patent is extended or adjusted under 35 U.S.C. 154(b) by 0 days.

(21) Appl. No.: 09/106,724

(22) Filed: Jun. 29, 1998

(51) Int. Cl.$^7$ .......................... H04L 25/34; H03M 7/00
(52) U.S. Cl. ........................................ 375/292; 341/59
(58) Field of Search ................................ 375/292, 242, 375/245, 253, 247; 341/59, 63, 67; 360/69, 48, 49

(56) References Cited

U.S. PATENT DOCUMENTS

| | | | |
|---|---|---|---|
| 4,234,897 A | 11/1980 | Miller | 360/45 |
| 4,486,739 A | 12/1984 | Franaszek et al. | 340/347 |
| 4,530,088 A | 7/1985 | Hamstra et al. | 370/110.1 |
| 5,177,482 A | * 1/1993 | Cideciyan et al. | 341/59 |
| 5,625,644 A | 4/1997 | Myers | 375/242 |
| 6,195,764 B1 | * 2/2001 | Caldara et al. | 714/30 |

OTHER PUBLICATIONS

"Low Cost Gigabit Rate Transmit/Receive Chip Set With TTL I/Os", Product Information by Hewlett Packard, 1997, 40 pages.

* cited by examiner

Primary Examiner—Chi Pham
Assistant Examiner—Khai Tran
(74) Attorney, Agent, or Firm—Skjerven Morrill MacPherson LLP; Edward C. Kwok

(57) ABSTRACT

A highly efficient bit encoder and a method related thereto are provided. The bit encoder transmit DC-balanced digital signals over a transmission line. To provide a DC-balanced signal, an input word's single-word disparity (SWD) value is compared to a running word disparity (RWD) value retrieved from a memory register. The RWD value indicates the cumulative DC-imbalance on the transmission line. If the disparity relationship of the SWD and the RWD satisfy a set of predefined rules, the input word is inverted to thereby offset the RWD. An inversion bit is appended to the digital input word to provide an output digital word to indicate to a receiver whether the transmitted output word is inverted to thereby permit recovery of the original system word. In one application, the DC-balanced signal transmits alternately control words and data words. A clock signal is transmitted on a separate clock transmission line to provide a clock signal for timing purposes and an embedded control signal indicating control or data mode.

15 Claims, 5 Drawing Sheets

APPARATUS AND METHOD FOR PROVIDING DIRECT CURRENT BALANCED CODE

BACKGROUND OF THE INVENTION

1. Field of the Invention

This invention relates to digital data communication, and more specifically to a system and method for providing D.C.-balanced digital code for high-speed, serialized digital data transmission over a transmission line.

2. Description of the Related Art

A transmission line typically has resistance causing both attenuation (loss) and distortion in the signals propagating on the transmission line. In general, the characteristic impedance of a transmission line is frequency-dependent, and can become a dominant portion of the total resistance of the transmission line at high frequencies. At high frequencies, signal attenuation for each frequency component is approximately proportional to the square root of the frequency. Consequently, the length of a transmission line is limited by this attenuation. Thus, for signals in the 10–100 megahertz range, such as video digital data signals, a short transmission line is required between a display and the video controller.

As signal attenuation increases in a transmission line, a small direct current (DC) or low frequency components in the signal may distort the digital signal sufficiently that the attenuated digital signal becomes unintelligible by the receiver, resulting in bit-errors. One method of minimizing DC or low frequency components in the transmission line is to DC-balance the digital signal by coding an equal number of 1's and 0's. So long as the number of 1's and 0's remain approximately equal, the net voltage on the transmission line is approximately zero.

A DC-balanced coding method can still be susceptible to disparities in single words. Disparity is a measure of the difference in the number of 1's and 0's in a bit pattern. Short bursts of 1's or 0's in a single word are unavoidable in data transmission. Such single-word '1' and '0' bursts can create a single-word disparity which results in a D.C. bias voltage that exceeds the maximum DC bias tolerable by the receiver, thus causing signal corruption. One coding method which overcomes the single-word disparity problem restricts the maximum run-length of consecutive 1's or 0's in a single digital word, thereby preventing a DC voltage build-up on the transmission line.

Various run-length restricted data encoding schemes have been applied. For example, in U.S. Pat. No. 4,530,088 to Hamstra et al., a 4-bit input code is mapped to a 5-bit non-return to zero inverted (NRZI) transmission code, using either a look-up table in ROM or a hardwired logic array to map the 4-bit input word into the 5-bit NRZI code. Hamstra discloses a set of 24 valid characters out of a possible 32 characters. U.S. Pat. No. 4,486,739 to Franaszek et al. also describes a DC-balanced code, and a circuit for translating an 8-bit input word into a 10-bit output word. Like Hamstra, Franaszek uses a ROM or a logic array to map input data to a coded transmission word. In this case, 256 8-bit combinations are mapped into 10-bit values as code and control words.

Similarly, U.S. Pat. No. 5,625,644 to Myers selects 16 code words and 3 control words from a possible 256 words, using a ROM or a logic array to map 4-bit input words into 8-bit output words.

In each of the above methods, the encoder requires substantial valuable die area for the ROM or logic array circuits which map the input codes to the output codes. Further, since a longer word necessarily requires more bandwidth, mapping an input word to a longer output word results in the loss of bandwidth utilization efficiency. For example, in the Myers '644 patent mentioned above, mapping a 4-bit input word into an 8-bit output word results in a 50% drop in transmission efficiency.

Accordingly, a DC-balanced data encoding system with a high bandwidth utilization efficiency is desired. Preferably, such a DC-balanced code system should not require a ROM or a logic array circuit, so as to reduce the requirements for semiconductor surface area.

SUMMARY OF THE INVENTION

The present invention provides a DC-balanced coding system and a method for transmitting high-frequency serial digital data on a transmission line. In one embodiment, a system of the present invention provides an output word that is longer than the input word by one bit, without using a ROM, or a logic gate array, thus minimizing circuit area requirement.

An encoder of the present invention frames or divides an input word into multiple "framed" words each shorter or equal to the input word. For example, the present invention may divide or frame a 24-bit input word into 3 channels of 8-bit framed words, or into 4 channels of 6-bit framed words. The framed word may be any number of bits, but limited by both the DC voltage bias resulting from an accumulated imbalance of '1's and '0's transmitted tolerated by the receiver and the bandwidth efficiencies desired. Although greater bandwidth efficiencies can be realized with longer words, the word length is constrained by the maximum allowable single word disparity (SWD) for a word. If all of the bits in an N-bit word were 1s, for example, then the SWD for that word is +N. Similarly, if all of the bits in the word are 0's, the SWD for that word is −N. If the magnitude of the SWD exceeds the tolerable imbalance, data corruption at the receiver may occur.

The present invention balances the desire for bandwidth efficiency with the need to avoid data corruption. In one embodiment of the present invention, a single inversion bit is appended to an N-bit output word, so that the transmission efficiency is equal to N/(N+1). For a small N, e.g., N equals 2, an efficiency of 67% results. Naturally, a longer word increases the bandwidth efficiency subject to the SWD constraint discussed above. An optimal input word length can be empirically determined in any given system.

In one embodiment, the present invention selects for an output word one of two representations, depending on the input word's SWD, and a running cumulative word disparity (RWD) of the previous output words. In that embodiment, the output word can be represented either by the input word or the input word's complement ("inverted"). A counter circuit calculates the SWD of each input word. A running word disparity (RWD) register provides the RWD for the encoder channel. The encoder selects for the output word the one of the two representations that would reduce the magnitude of the RWD, and indicate the selection by the appended inversion bit. The RWD register is updated after transmission of each output word.

In one implementation, a comparator compares the input data word's SWD to the RWD of the RWD register. The input data word is either inverted or left un-inverted depending upon the values of SWD and RWD. For example, the following selection rules can be applied:

TABLE I

| SWD VALUE | RWD VALUE | OUTCOME |
|---|---|---|
| >0 | >0 | Inverted input word |
| ≦0 | <0 | Inverted input word |
| Don't Care | =0 | Inverted input word |
| ≦0 | >0 | input word |
| >0 | <0 | input word |

According to another aspect of the present invention, each encoder channel transmits both data and control words. In one embodiment, the control words can each be represented by a "positive code", with a positive SWD, or a "negative code", with a negative SWD. For example, the high logic state of a control signal may be indicated by the negative code '1110000' and the positive code '1111000', and the low logic state of the control signal may be represented by the negative code '1100000' and the positive code '1111100'. The one of the two representations which reduces the magnitude of the RWD is selected, so that the data on the transmission line remains D.C.-balanced on the average. For example, the following selection rules can be used:

TABLE II

| RWD VALUE | CONTROL STATE | CONTROL WORD SELECTED |
|---|---|---|
| >0 | High | negative code |
| ≦0 | High | Positive code |
| >0 | Low | negative code |
| ≦0 | Low | positive code |

In one embodiment, multiple encoders transmit output words of multiple channels over a single transmission line. In that embodiment, a multiplexor multiplexes the data in each channel onto the single transmission line, and the encoder channels cooperate to ensure that the RWD of the transmitted data is no greater than the maximum imbalance tolerable by the receiver. In another embodiment, each encoder channel transmits on a separate transmission line. Advantageously, as compared to a single transmission line, multiple transmission lines permit lower bit rate in each line to achieve the same total throughput. A lower bit rate results in lower signal attenuation and distortion, and permits longer words as greater imbalance can be tolerated.

In one encoder of the present invention, in addition to a data transmission line, a separate clock transmission line transmits a control signal (e.g., a data enable signal) which indicates to the receiver whether data words or control words are being transmitted over the data transmission line. In that embodiment, the control signal is encoded in the clock timing signal.

Since a control word's positive and negative codes need not be complementary, an inversion bit on the clock/control signal is not necessary. For example, a 3-high, 4-low bit pattern may be used as negative code for one state of a control signal indicating a data enable mode. A corresponding positive code can be a 3-low, 4-high bit pattern. Similarly, a 2-high, 5-low bit pattern can be used as a negative code for the complementary state of the same control signal. A corresponding positive code for that complementary state can be 2-low, 5-high bit pattern.

In one embodiment, each control word has an equal number of 0's and 1's (zero SWD). For example, the data enable high control state may be the bit pattern '000111' and the data enable low control state may be the bit pattern '111000'.

According to another aspect of this invention, a receiver circuit is provided to receive the encoded output words and the clock control signal. To reconstruct the input word, an inversion bit detector examines the inversion bit.

BRIEF DESCRIPTION OF THE DRAWINGS

The present invention may be better understood, and its numerous objects, features, and advantages made apparent to those skilled in the art by reference to the accompanying drawings.

DETAILED DESCRIPTION OF THE PREFERRED EMBODIMENTS

Figure 1:
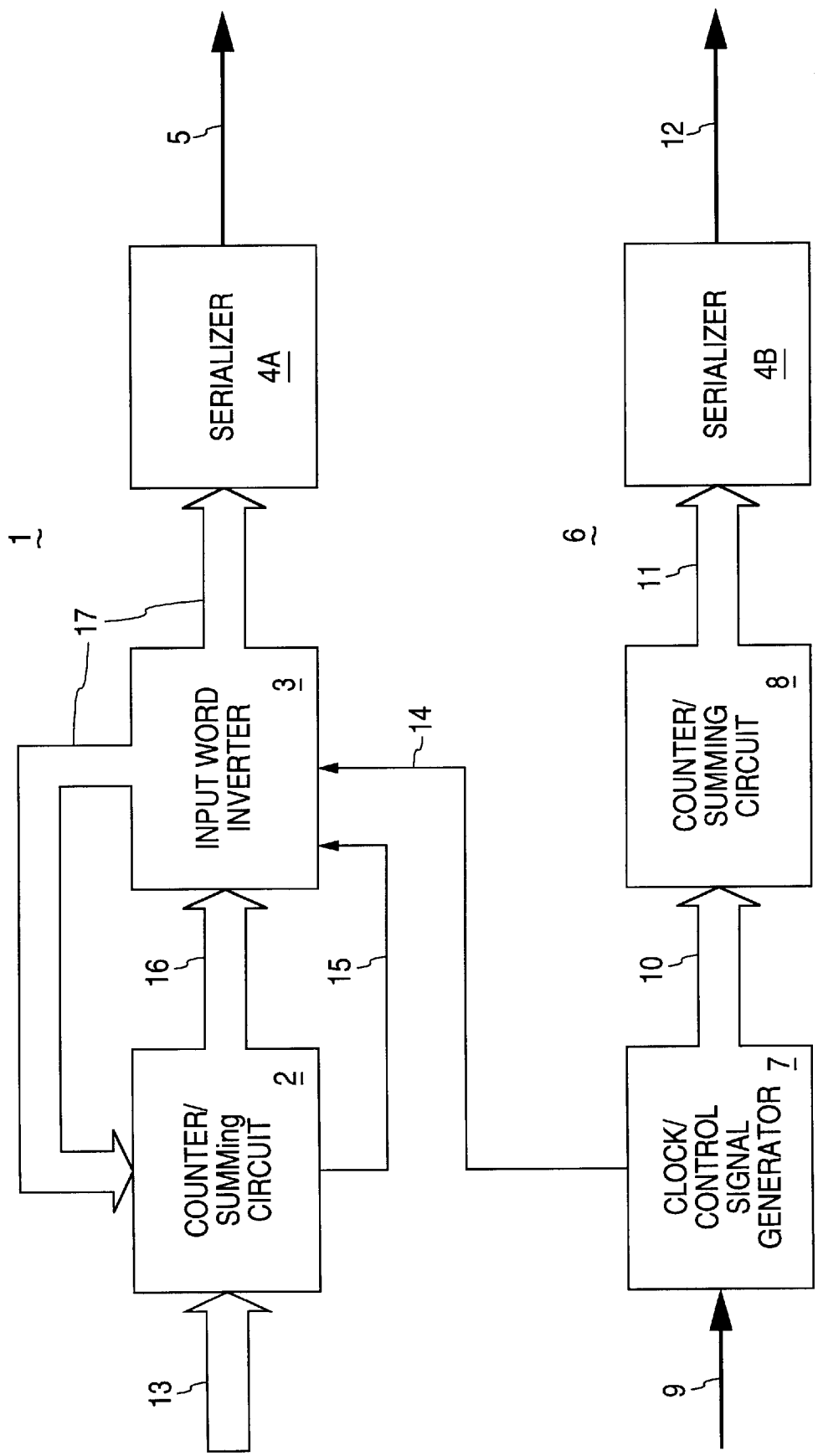
FIG. 1 is a block diagram showing a digital signal encoder channel of this invention.

While the invention is illustrated hereinbelow with reference to the embodiments described, these embodiments are presented as examples and not intended to limit the invention. Numerous modifications, alternatives and equivalents within the scope of the invention are possible. In the following description, to simplify discussion, like elements in the various figures are provided like reference numerals.

FIG. 1 is a block diagram in one embodiment of the present invention, which is provided a data/control encoder channel 1 and a clock channel 6 . Data/control encoder channel 1 includes (a) a counter and summing circuit 2 , which receives an input word on bus 13 in parallel and provides the input word on bus 16 , and (b) an inverter 3 , which receives its input word from bus 16 to provide an output word on bus 17 . An output serializer 4A converts the parallel output words of inverter 3 into serial signals for transmission over transmission line 5. Clock channel 6 includes (a) a clocking signal and control signal generator 7, which receives an external control signal at line 9 and provides a parallel word at bus 10, (b) a counter and summing circuit 8, which receives the parallel word at bus 10 to provide an output word at bus 11, and (c) a serializer circuit 4B for serializing the output word of bus 11. (Alternatively, clock/control signal generator 7 can also provide serial digital signal output, thereby eliminating the need for serializer 4b.) In the embodiment shown, an output serializer 4b converts parallel digital clock/control signals from bus 11 into serial digital clock/control signals for transmission over transmission line 12.

In one application, clock channel 6 transmits a "data enable" signal over line 12 to indicate to a receiver (not shown) whether the transmitted signals by data/control encoder channel 1 over line 5 are data signals or control signals. Data/control encoder channel 1 toggles between a "data mode" and a "control mode". Data or control mode is indicated by an external control signal at terminal 9. Clock/signal generator 7 indicates to channel 1 "control" or "data" mode by a control signal on line 14. Control mode typically occurs during a "blanking interval" in the video data.

In data mode, a digital data word is received on data bus 13 into counter/summing circuit 2, which calculates a single-word disparity (SWD) for the input digital word. In this embodiment, a '1' logic value in each bit is assigned a disparity of 1 and a '0' logic value in each bit is assigned a disparity of −1. The SWD can be calculated by summing the disparities of the digital word. This summing can be achieved, for example, by an up-down counter "counting up" for each logic '1' bit and "counting down" for each logic '0' bit. Counter/summing circuit 2 compares the SWD to a running word disparity (RWD), which is the cumulative sum of the disparities of previously transmitted output words of encoder channel 1. Counter/summing circuit 2 then provides a control signal on line 15 indicating whether inverter 3 should provide on bus 17, as its output word, the input word or a bit-wise complement of the input word (i.e., the "inverted" input word). Inverter 3 provides the bit-wise complement of the input word if: (a) SWD and RWD have the same sign, (b) RWD equals 0, or (c) RWD less than 0 and SWD=0. Otherwise, inverter 3 provides the input word as its output.

An inversion bit is then appended to the output word of inverter 3 to indicate whether the output word of inverter 3 is a bit-wise complement of the input word received by counter/summing circuit 2, so as to allow a receiver to decode the output word. In one embodiment, the inversion bit is set to high (i.e., logic value '1') if the input word has been inverted, and low (e.g., logic value '0') if the input word is not inverted. The output word on bus 17, together with the inversion bit, are fed back to the counter/summing circuit 2 to update the current RWD.

Serializer circuit 4A receives the output word from inverter 3 bus 17 and the inversion bit to provide a DC-balanced serial signal on line 5 for transmission.

The frequency of the clocking signal over transmission line 12 is appropriately set such that each transmitted output word on line 5 is synchronized with a control word provided by clock channel 6 on line 12. In one embodiment, the counter/summing circuit 2, the input word inverter 3, and the serializer 4A are provided registers to permit pipelined signal processing.

Figure 2A:
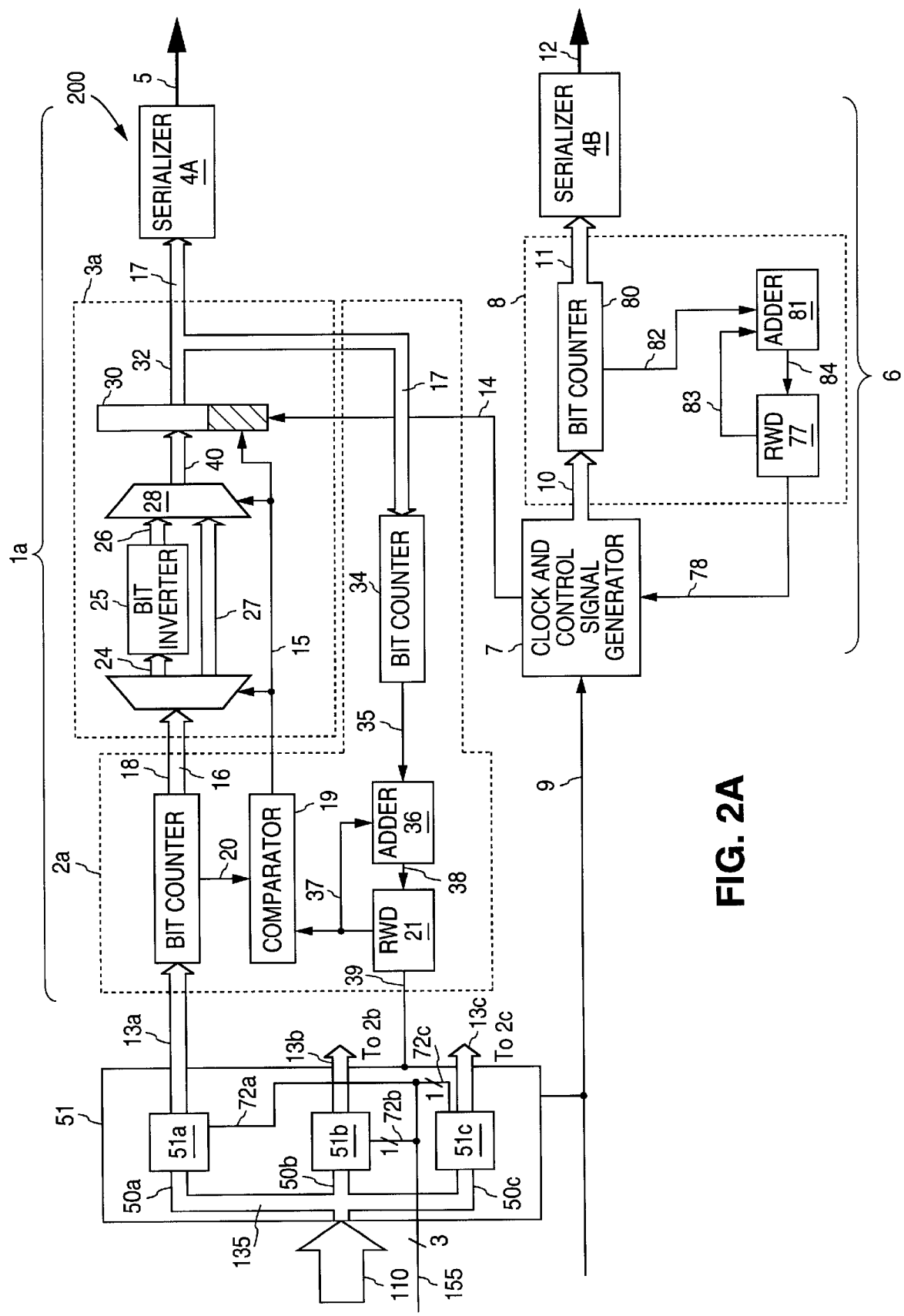
FIGS. 2A and 2B are block diagrams showing a data/control encoder channel 1a, clock channel 6 and a controller 51a in a digital signal encoder system 200.

FIG. 2A shows one implementation of data/control encoder channel 1 and clock channel 6 of FIG. 1 in an encoder system 200 of the present invention. As shown in FIG. 2A, encoder system 200 receives from a graphics controller (not shown) (a) video data on an 18-bit output bus 110, and (b) three control signals on a 3-bit control bus 155. The 18-bit video data is received into a controller module 51 of encoder system 200 and split by a framing circuit 135 into three 6-bit data streams 50a, 50b and 50c to be processed respectively by controllers 51a, 51b and 51c. Similarly, the signals on 3-bit bus 155 is also provided to controller module 51, providing one signal each at terminals 72a, 72b and 72c of controllers 51a, 51b and 51c, respectively. Within each of controllers 51a, 51b and 51c, the 6-bit data stream is multiplexed with control words generated in accordance with the control states at terminals 72a, 72b and 72c to provide a data/control word stream. The data/control streams of controller module 51 are provided to channels 1a, 1b, and 1c on 6-bit bus 13a, 13b and 13c, respectively, under the control and data modes described above. In FIG. 2A, only channel 1a is shown in detail, since channels 1b and 1c are each configured in substantially the same manner as channel 1a. Channel 1a includes counter/summing circuit 2a, inverter 3a and serializer 4a, corresponding respectively to counter/summing circuit 2, inverter 3 and serializer 4a discussed above with respect to FIG. 1. In addition, encoder system 200 includes a common clock channel 6, substantially as discussed above with respect to FIG. 1.

As shown in FIG. 2A, counter/summing circuit 2a includes a bit counter 18 for counting the '1' and '0' bits of input word on bus 13a to provide a single-word disparity (SWD). An up-down counter, for example, would be suitable for implementing bit counter 18. Under data mode, comparator 19, which receives the SWD on line 20 from bit counter 18 and a current running word parity (RWD) from RWD register 21 via line 37, compares the RWD to the SWD according to the rules provided in Table I (above) to provide on line 15 a single control bit indicating whether the input word or its bit-wise complement should be provided as the output word of data/control encoder channel 1a. Under control mode, the control word to be output is determined in controller 51a, according to a control signal at terminal 39, which indicates whether or not the RWD in RWD register 21 is greater than zero. The control word to be output is selected in controller 51a according to the rules set forth, for example, in Table II above.

Under data mode, the input data word on bus 13a is provided by counter/summing circuit 2a to terminals 27 or the input terminals 24 of bit-inverter circuit 25, according to whether or not a bitwise complement of the input word is to be output. Bit inverter 25 provides a bit-wise inverted output word on bus 26. Under control mode, the control word is provided at terminals 27. A multiplexer 28 selects as output at terminals 40 either the output word of bit inverter 25 on bus 26 or the input word at terminals 27.

The output word at terminals 40 is then stored in buffer 30. For each inverted data output words (i.e., data mode), a '1' is set in buffer 30 at the position of the inversion bit, to indicate that the data word is inverted. In this embodiment, since all control words are assigned a logic '1' at the bit position corresponding to the invert bit, the inversion bit is also set under control mode. The content of buffer 30 is provided as the encoded output word on bus 32. Bit counter 34, which input terminals are coupled to bus 32, provides at input terminals 35 of adder circuit 36 the SWD of the encoded output word. Adder circuit 36 updates the RWD by adding the SWD at terminals 35 to the RWD currently in RWD register 21 (line 37). Serializer 4A serializes the encoded data word on bus 32 for transmission over transmission line 5.

Under control mode, encoder channel 1 provides DC-balanced control words over transmission line 5. As discussed above, under control mode, encoder channel 1a receives control words on bus 13a from controller 51a (discussed in further detail below with respect to FIG. 2B). In this embodiment, each control state is represented by one of two bit patterns of oppositely signed SWDs. Thus, a control word representing the logic high state of a control variable can be represented by a 7-bit word of 5 '1' bits and 2 '0' bits (e.g., "1111100"), for a SWD of 3, and by a 7-bit word of 2 '1' bits and 5 '0' bits (e.g., "1100000"), for a SWD of −3. Similarly, the logic low state of the control variable can be represented by a 7-bit words of 3 '1' bits and 4 '0' bits (e.g., "1110000"), for an SWD of −1, and by a 7-bit word of 4 '1' bits and 3 '0' bits (e.g., "1111000"), for a SWD of 1. In either state, DC-balance is maintained by determining the disparity value of RWD and selecting the appropriate complementary bit pattern that will offset the RWD.

To indicate to a receiver the control and data modes, a control word DE is embedded by clock channel 6 onto clock transmission line 12. Transmission on clock transmission line 12 should be DC-balanced also. In this embodiment, the length of control word DE is conveniently the same as the encoded output word of encoder channel 1. As shown in FIG. 2A, clock control and signal generator 7 provides on bus 10, as the clock output word on transmission line 12, the positive or negative SWD representation for the current logic state of control signal DE according to the RWD of transmission line 12. The RWD of transmitted words on transmission line 12 is maintained, as discussed above with respect to FIG. 1, in counter/summing circuit 8. A bit counter circuit 80 computes the SWD of the clock output word on bus 10 and updates the RWD through adder circuit 81. The clock output word is then provided to the input terminals 11 of serializer 4a for serial transmission over transmission line 12.

Figure 2B:
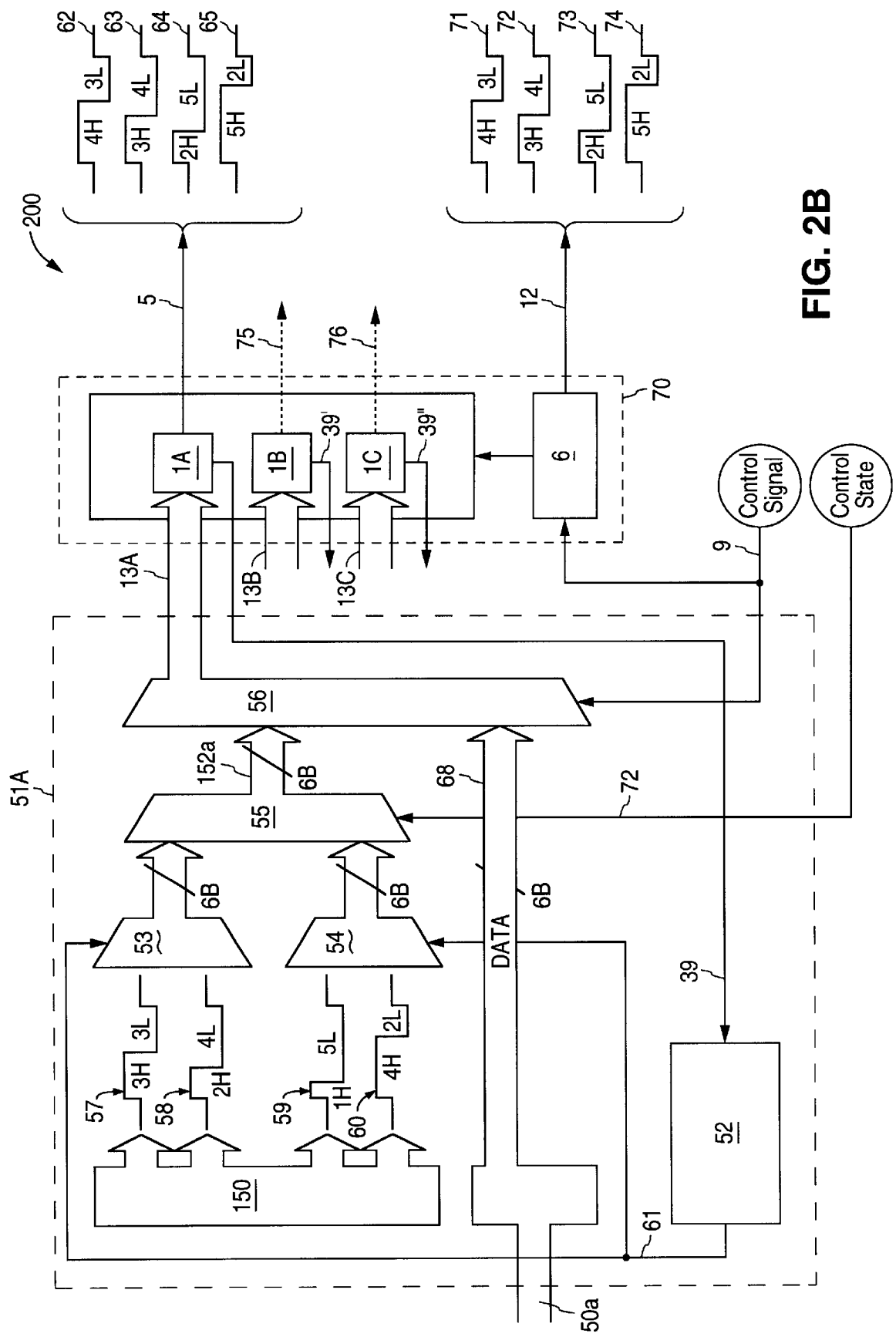

> FIG. 2B shows controller 51A in further detail. (Controllers 51B and 51C, which are each substantially the same as controller 51A, are not shown in FIG. 2B for clarity). As discussed above, encoder system 200 includes encoder channels 1A, 1B and 1C, which provide encoded control and data words output at transmission lines 5, 75 and 76 respectively. (Alternatively, of course, the encoded control and data words output of transmission lines 5, 75 and 76 can be multiplexed and transmitted on a single transmission line). Encoder system 200 also includes clock channel 6, which receives an external signal at terminal 9 indicating whether control or data words are to be transmitted on transmission lines 5, 75 and 76.

As shown in FIG. 2B, controller 51A includes a control word generator 150 which generates the control words. Data words are received from a graphics controller into controller 51a over bus 50a, as discussed above. In this embodiment, word generator 150 generates both positive and negative SWD representations for each logic state of a control word.

Control circuit 52 selects, through multiplexer 53 and 54, either the positive code word or the negative code word for each logic state of a control signal, based on feedback control signal 39 from encoder channel 1A, indicating whether or not the current RWD is greater than zero. Multiplexer 55 then selects the appropriate code word, according to the logic state of the control signal, indicated by the signal on line 72. External control signal 9, indicating whether the current mode is "data" or "control", then selects through multiplexer 56 from the data stream of bus 68 and the selected control word on bus 152a.

Data/control encoder channels 1B and 1C can each independently provide control signals on lines 39' and 39" to their respective controllers 51B and 51C, respectively, to indicate the status of their respective RWDs, thereby permitting each channel to independently provide D.C.-balance encoding of control word or data word for transmission on each of the respective transmission lines 5, 75, and 76. In this embodiment, since a single clock channel is used, all channels are in data mode or control mode simultaneously.

Every 7-bit interval, clock channel 6 transmits one of the 7-bit clock/control words 71–74 to indicate to the receiver over transmission line 12 whether control words or data words are being transmitted over transmission lines 5, 75, and 76. In this embodiment, clock/control words 71–72 both indicate "data" mode, and clock/control words 73–74 both indicate control mode. (The bit patterns of clock/control words 71–74 shown in FIG. 2B are selected for ease of decode; each of control words 71–74 can be decoded by the position in time of its single 1-to-0 transition). Clock/control words 71–74 can be generated on-chip, using a control word generator similar to the control word portion of control/data word generator 150 discussed above. Alternatively, the control words of clocks channel 6 can be generated off-chip.

FIG. 2B provides, as one example, 6-bit wide control words 57, 58, 59, and 60, together with the inversion bit provided at buffer 30 of channel 1a, are serialized as 7-bit output control words 62, 63, 64, and 65. As shown in FIG. 2B, the inversion bit occupies the left-most bit in each output word. For example, 6-bit input control word 57 has 3 '1' bits and 3 '0' bits. The corresponding output control word 62 is 4 '1' bits and 3 '0' bits. Similarly, 6-bit control word 59 has 1 '1' bit and 5 '0' bits, and the corresponding output control word 65 is has 2 '1' bits and 5 '0' bits.

Figure 3:
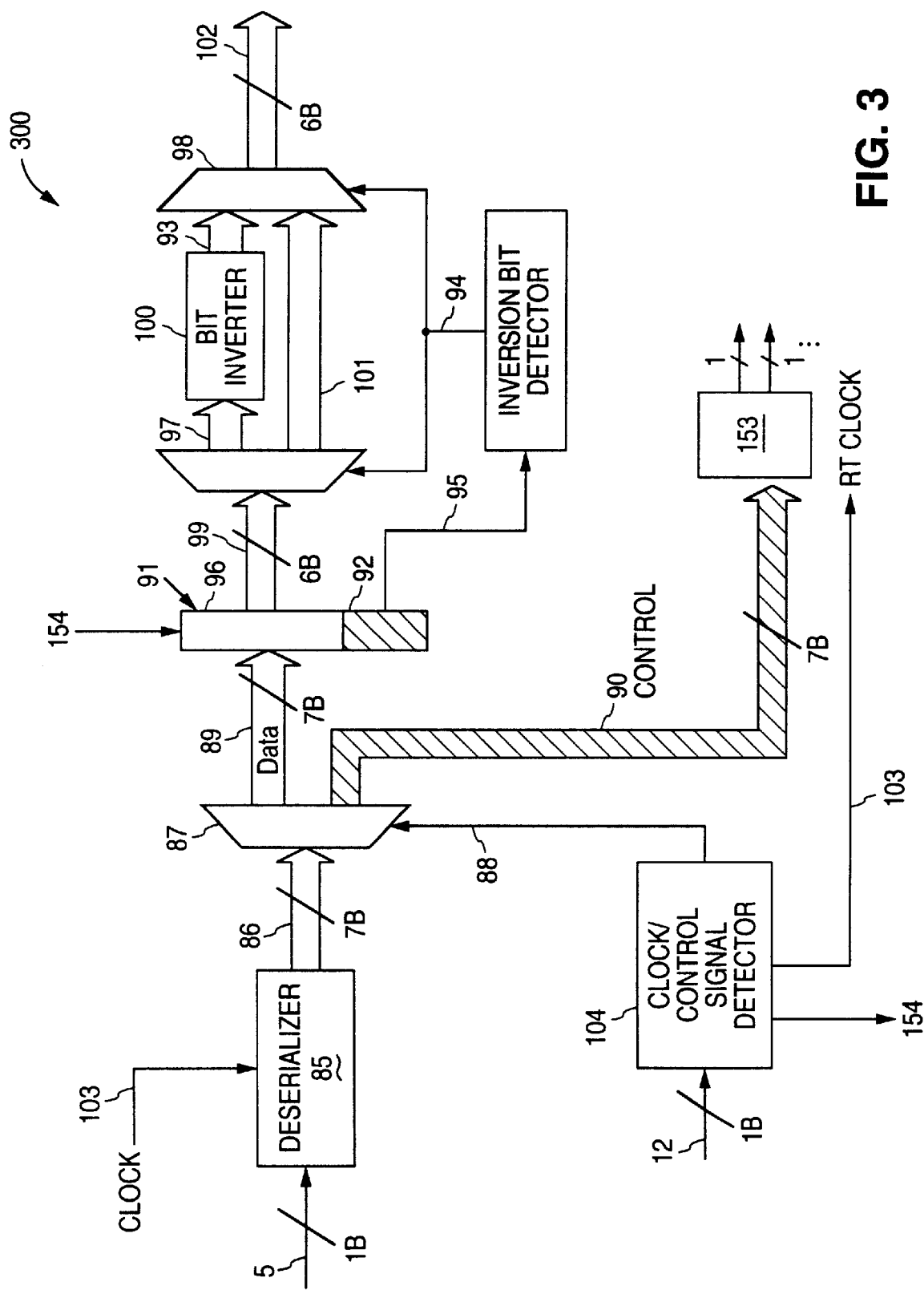
FIG. 3 is a block diagram of a data channel 300 in a receiver which decodes data signals encoded in accordance with the present invention.

FIG. 3 is a block diagram of a data channel 300 of a receiver which decodes the encoded data words transmitted by data encoder channel 1a. As shown in FIG. 3, de-serializer 85 receives from transmission line 5 serialized output data or control words. Each data or control word is then placed in parallel onto bus 86 and demultiplexed onto either data bus 89 or control bus 90, according to the encoded clock/control word simultaneously received at transmission line 12. Clock signal detector 104 decodes the encoded clock/control word received to determine if the encoded word received on transmission line 5 is a control word or a data word. During data mode, the data word on bus 89 is latched into register 91 and placed, stripped of the inversion bit at position 92, onto buses 97 and 101. Bus 97 is coupled to the input terminals of bit inverter 100, which provides a bit-wise complement of the data word on bus 97 at bus 93. The inversion bit, provided on line 95, is then used to control multiplexer 98 to select, for output as a decoded word on bus 102, between the word on bus 101 or the bit-wise complement on bus 93. The decoded word of channel 300 is then combined with other decoded words of other data channels, if any, to reconstitute the original data stream.

Control words on bus 90 are processed by a controller circuit 153, to provide for each control variable a 1-bit logic state. Clock signal detector 104 recovers, from the encoded clock control words received from transmission line 12, a bit clock signal (line 103) and an embedded 7-bit/byte clock signal (line 154). The 7-bit/byte clock signal on line 154 provides synchronization among the various elements of the receiver circuit and with the incoming data and control words to permit pipelined processing.

Figure 4:
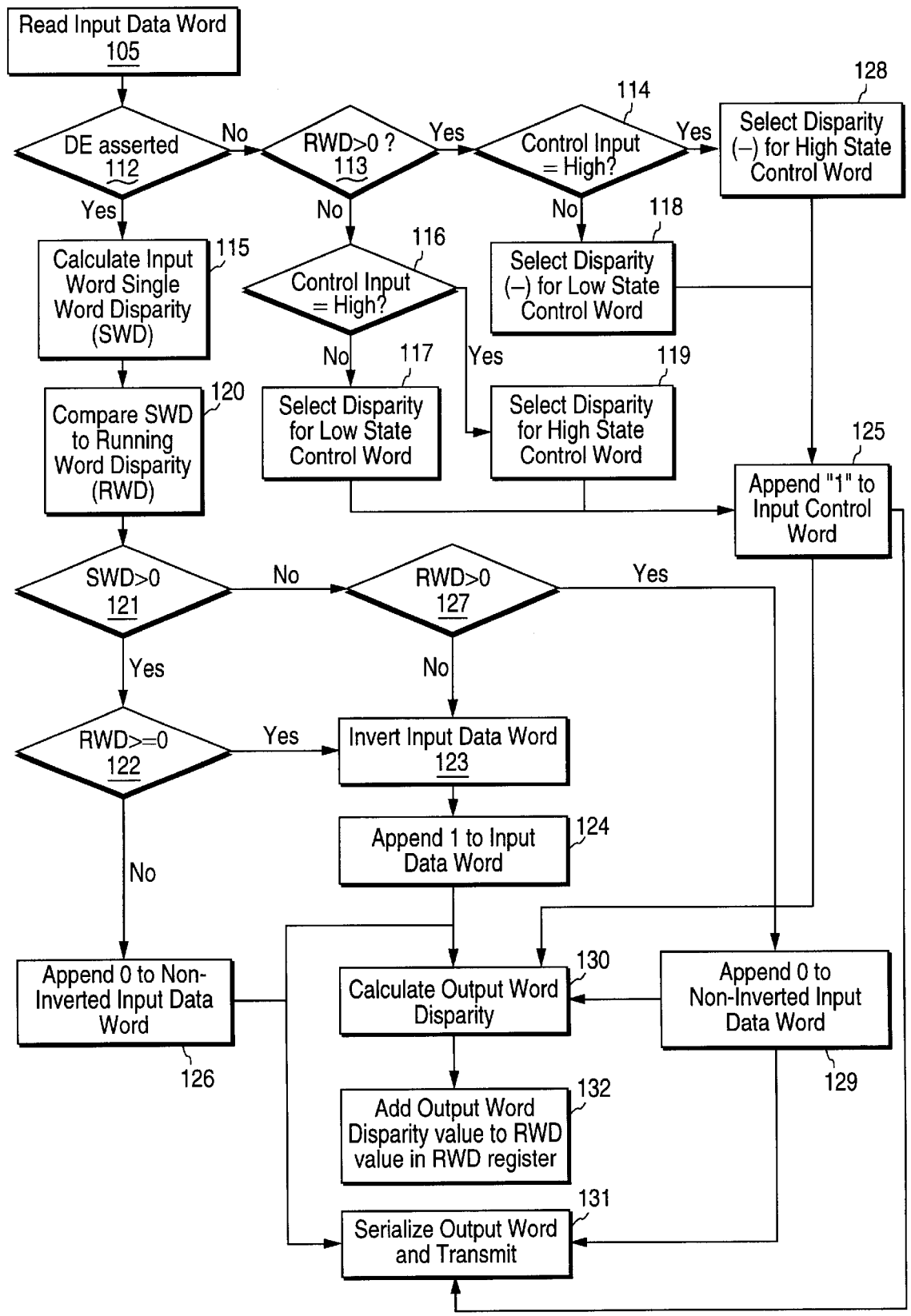
FIG. 4 is a flow diagram of a method for encoding digital signals to provide DC-balanced code.

FIG. 4 is a flow diagram of a method for encoding digital data for DC-balanced transmission over a transmission line, according to one embodiment of the present invention. As shown in FIG. 4, a digital input word is read at step 105. The input word read has a length allowable for the purpose of DC-imbalance tolerance requirements (i.e., its maximum SWD is less than a given value). Then, at step 112, the processing mode is ascertained so as to determine whether the input word is a control word or a data word.

If the processing mode is determined to be "data mode", the SWD of the input word is calculated at 115. At step 120, the calculated SWD is compared to an RWD. If the SWD is determined to be greater than zero (step 121) and RWD is determined to be greater than or equal to zero (step 122), then the input word is inverted at step 123, so that its SWD is equal in magnitude, but opposite in sign to its original value. At step 124, an asserted inversion bit is then appended to the inverted word to indicate that the input word has been inverted. However, at step 126, if the RWD is determined to be less than zero (step 122), then the input word is not inverted and an inactive inversion bit is appended to the input word to indicate that the input word is not inverted.

If the SWD of the input word is determined to be less than or equal to zero (step 121), and the RWD is determined to be less than or equal to zero (step 127), then the input word is inverted at step 123, so that its SWD value is equal in magnitude and opposite in sign to its original value. An asserted inversion bit is then appended to the inverted word at step 124 to indicate that the input word has been inverted.

If the RWD is determined to be greater than zero (step 127), then the input word is left intact and an inactive inversion bit is appended at step 129 to the input word to indicate that the input word is not inverted.

However, if the processing mode is determined at step 112 to be "control mode," the RWD is determined to be less than or equal to zero (step 113), and the state of the control signal is determined to be logic low (step 116), then a non-negative SWD control word for the logic low control state is selected at step 117. However, if the state of the control signal is determined to be logic high (step 116), then the control word having a non-negative SWD for the logic high control state is selected at step 119. At step 125, regardless of whether the state of the control signal is determined at step 116 to be at logic high or at logic low, a '1' is provided at a predetermined bit position of the control word (i.e., the bit position corresponding to the inversion bit position of the data word).

Returning to step 113, if the RWD is determined to be greater than zero, and the state of the control signal is determined to be at logic high at step 114, then a control word with a negative SWD is selected at step 128 to indicate the logic high state of the control signal. Alternatively, if the state of the control signal is determined at step 114 to be at logic low, then a control word with a negative SWD is selected at step 118. At step 125, regardless of whether the state of the control signal is determined to be at logic high or at logic low at step 114, a '1' is provided at a predetermined bit position of the control word (i.e., the bit position corresponding to the inversion bit position of the data word).

The SWD of the output word is calculated at step 130, and added to the current RWD in the encoder's RWD register at step 132 to provide an updated RWD value. If not already serialized, the output data/control word is serialized for DC-balanced transmission at step 131 over a transmission line.

An operational truth table for a data encoder channel of the present invention is provided below, summarizing the encoding process described above and in FIG. 4, and showing the output word pattern resulting therefrom.

TABLE III

| RWD | mode | CS | SWD | I | SD |
|---|---|---|---|---|---|
| >0 | data | DC | >0 | 1 | Inverted input word |
| >0 | data | DC | <=0 | 0 | input word |
| <0 | data | DC | >0 | 0 | input word |
| <0 | data | DC | <=0 | 1 | Inverted input word |
| 0 | data | DC | DC | 1 | Inverted input word |
| >0 | control | 0 | DC | 1 | 110000 |
| <=0 | control | 0 | DC | 1 | 111000 |
| >0 | control | 1 | DC | 1 | 100000 |
| <=0 | control | 1 | DC | 1 | 111100 |

Where:
DE = data enable control signal. When DE is asserted, the encoder channel is encoding data input words. When DE is not asserted, the encoder channel is processing control inputs.
CS = The logic state (i.e., 0 or 1) of a control signal.
I = the inversion bit appended to a 6-bit quantity to form the encoded output data word.
SD = the 6-bit portion of an output encoded data word which corresponds to either an inverted or non-inverted 6-bit input word, D.
DC = don't care Table III above shows that the 6-bit portion (SD) of the output encoded word is inverted according to the RWD and the SWD of the input data word as described above. In addition, SD assumes a predetermined bit pattern under control mode. The predetermined bit pattern can be any bit pattern so long as it is a bit pattern with an SWD which would reduce the magnitude of the current RWD, when included.

An operational truth table (Table IV) for a clock channel of the present invention is provided below and showing the output clock control signal pattern resulting therefrom.

TABLE IV

| RWD | mode | Clock/Control Code Word |
|---|---|---|
| >0 | data | 1110000 |
| <=0 | data | 1111000 |
| >0 | control | 1100000 |
| <=0 | control | 1111100 |

Thus, the above detailed description illustrates the present invention using a system for transmitting DC-balanced digital signals over a transmission line without using a ROM or logic gate array. Various modifications and variations within the scope of the present invention are possible. The present invention is set forth in the following claims.

I claim:

1. An encoder circuit for DC-balanced transmission of digital signals over a transmission line, comprising:
   a) a counter circuit receiving an input word and a running word disparity (RWD), said counter circuit computing a single-word disparity (SWD) for said input word, and comparing said SWD to said RWD and for providing a first control signal indicating whether or not a sum of said SWD and RWD has a magnitude less than a magnitude of said RWD; and
   b) an inverter circuit receiving said first control signal and said input word from said counter circuit, said inverter circuit providing an output word, said output word comprising one of (i) a bit-wise complement of said input word and another bit indicating that a bit-wise complement operation was performed on said input word, when said first control signal indicates that said sum of said SWED and RWD has a magnitude less than the magnitude of said RWD, and (ii) said input word and another bit indicating that said bit-wise complement operation was not performed on said input word.

2. An encoder circuit as in claim 1, further comprising a serializer for serializing said output word for transmission over a transmission line.

3. An encoder circuit as in claim 2 further comprising a clock circuit for transmission of a digital clocking signal, said clocking signal having encoded therein a second control signal.

4. An encoder circuit as in claim 3 wherein said second control signal is a data enable signal indicating whether or not said output word is a data word or a control word.

5. An encoder circuit as in claim 2 wherein said counter circuit includes:
   a) a bit counter circuit computing said SWD;
   b) an RWD register for storing therein said RWD, wherein said RWD is a cumulative sum of output word SWDs transmitted over said transmission line;
   c) a comparator circuit receiving said SWD and said RWD from said RWD register, for providing said first control signal; and
   d) an adder circuit coupled to receive said output word and said RWD, said adder circuit updating said RWD by adding said SWD to said cumulative sum of output word SWDs transmitted over said transmission line.

6. An encoder system for encoding a digital word for transmission on a transmission line, comprising in operative combination:

a) a framing circuit for dividing said digital word into multiple framed input words; and b) multiple encoder channels coupled to said framing circuit, each encoder channel receiving a respective one of said framed input words, each encoder channel including:

i) a counter circuit for calculating a single-word disparity (SWD) for said frame input word, said counter circuit comparing said SWD with a running word disparity (RWD) value for said encoder circuit to generate a first control signal indicating whether or not a sum of said SWD and said RWD value has a magnitude less than a magnitude of said RWD value, and ii) an inverter circuit coupled to said counter circuit, said inverter circuit providing an output word, said output word comprising one of (1) a bit-wise complement of said input word and another bit indicating a logic state of said first control signal, when said first control signal is in a predetermined logic state, and (ii) said framed input word, and another bit indicating a logic state of said first control signal, when said first control signal is in a predetermined logic state.

7. An encoder system as in claim 6 further comprising a serializer for serializing said output word for serial transmission over a transmission line.

8. An encoder system as in claim 6 wherein said output word is parallel and said encoder system further comprises:

a) an output word multiplexor coupled to receive said output word of each of said encoder channels, said multiplexor multiplexing said output words of said encoder channels onto an output bus; and b) a serializer coupled to said output bus for serializing said output words for transmission over a transmission line.

9. An encoder system as in claim 6 further comprising a clock circuit for transmitting a clocking signal, said clocking signal having encoded therein a second control signal.

10. An encoder system as in claim 9 wherein said second control signal indicates for each output word whether said output word is a data word or a control word.

11. A method for transmitting a digital word over a transmission line, comprising the following steps:

a) calculating a single-word disparity (SWD) of an input word;

b) calculating a running word disparity (RWD), said RWD representing a sum of previous SWDs, previous SWDs being SWDs of digital words transmitted over said transmission line prior to transmission of said SWD;

c) comparing the SWD to the RWD to generate a control signal indicating whether or not a sum of said SWD and said RWD has a magnitude less than a magnitude of said RWD;

d) providing as an output word one of (i) a bit-wise complement of said input word, and another bit indicating that said output word includes said bit-wise complement of said input word, and (ii) said input word and another bit indicating said output word that said input word includes said input word; and f) transmitting said output word over said transmission line.

12. A method for transmitting of a digital word as in claim 11, further comprising:

a) for each logic state of a control signal, providing two bit patterns to represent said logic state of said control signal, said bit patterns having respectively a positive SWD and a negative SWD;

b) selecting, according to said logic state of said control signal and said RWD, one of said bit patterns such that a sum of an SWD of said bit patterns and said RWD has a magnitude less than the magnitude of said RWD;

c) transmitting said selected bit pattern over said transmission line.

13. A method comprising:

a) framing an input word into multiple framed input words;

b) providing said framed input words to one or more encoder channels, each encoder channel comprising:

i) a counter circuit for calculating a single word disparity (SWD) for said framed input word, said counter circuit comparing said SWD with a running word disparity (RWD) to generate a control signal indicating that a sum of said SWD and said RWD has a magnitude less than a magnitude of said RWD, and ii) an inverter circuit coupled to receive said control signal and framed input word from said counter circuit, said inverter circuit providing as an output word either (1) a bit-wise complement of said framed input word, appended thereto a bit indicating that said output word includes said bit-wise complement of said input word, when said control signal is in a first logic state, or (2) said framed input word, appended thereto a bit indicating that said output word includes said input word, when said control signal is in a second logic state; and c) transmitting said output words on one or more transmission lines.

14. A method as in claim 13 further including the step of multiplexing said output words onto a single serializer circuit for transmission over a single transmission line.

15. A method as in claim 13 wherein said step of providing comprises:

(a) multiplexing said framed input words onto a single input word bus; and (b) providing an encoder channel coupled to said input word bus to encode said framed input words.

* * * * *

UNITED STATES PATENT AND TRADEMARK OFFICE
CERTIFICATE OF CORRECTION

PATENT NO. : 6,351,501 B1
DATED : February 26, 2002
INVENTOR(S) : Murdock, Gary

It is certified that error appears in the above-identified patent and that said Letters Patent is hereby corrected as shown below:

<u>Title page,</u>
Item [73] should read as follows: -- National Semiconductor Corporation --.

Signed and Sealed this

Twenty-third Day of July, 2002

Attest:

Attesting Officer

JAMES E. ROGAN
*Director of the United States Patent and Trademark Office*